US008940574B2

(12) United States Patent
Wang et al.

(10) Patent No.: US 8,940,574 B2
(45) Date of Patent: Jan. 27, 2015

(54) METAL GRID IN BACKSIDE ILLUMINATION IMAGE SENSOR CHIPS AND METHODS FOR FORMING THE SAME

(75) Inventors: Chih-Chien Wang, Changhua (TW); Chu-Wei Chang, Tainan (TW); Wang-Pen Mo, Pingtung (TW); Hung-Chang Hsieh, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/449,019

(22) Filed: Apr. 17, 2012

(65) Prior Publication Data

US 2013/0270667 A1  Oct. 17, 2013

(51) Int. Cl.
*H01L 27/146* (2006.01)
*H01L 31/0232* (2014.01)
*H01L 31/20* (2006.01)

(52) U.S. Cl.
USPC .............. 438/72; 438/73; 438/70; 438/80; 257/E27.133; 257/E27.132

(58) Field of Classification Search
CPC ....................................................... H01L 27/46
USPC ............................................. 438/73, 70, 72
See application file for complete search history.

(56) References Cited

U.S. PATENT DOCUMENTS

| | | | |
|---|---|---|---|
| 2006/0104564 A1* | 5/2006 | Catrysse et al. | 385/14 |
| 2007/0064188 A1* | 3/2007 | Okamoto | 349/135 |
| 2008/0036950 A1* | 2/2008 | Yi et al. | 349/106 |
| 2009/0168181 A1* | 7/2009 | Su et al. | 359/586 |
| 2010/0244173 A1* | 9/2010 | Wang et al. | 257/435 |
| 2010/0246212 A1* | 9/2010 | Yang et al. | 362/607 |
| 2011/0037883 A1 | 2/2011 | Lee et al. | |
| 2011/0226934 A1* | 9/2011 | Tian et al. | 250/208.1 |
| 2012/0019695 A1* | 1/2012 | Qian et al. | 348/273 |
| 2012/0037960 A1* | 2/2012 | Yokoyama et al. | 257/230 |
| 2012/0086091 A1* | 4/2012 | Crocherie | 257/432 |

FOREIGN PATENT DOCUMENTS

KR   1020110016078   2/2011

* cited by examiner

*Primary Examiner* — Su Kim
*Assistant Examiner* — Regan J Rundio
(74) *Attorney, Agent, or Firm* — Slater & Matsil, L.L.P.

(57) ABSTRACT

A method includes forming a plurality of image sensors on a front side of a semiconductor substrate, and forming a dielectric layer on a backside of the semiconductor substrate. The dielectric layer is over the semiconductor substrate. The dielectric layer is patterned into a plurality of grid-filling regions, wherein each of the plurality of grid-filling regions overlaps one of the plurality of image sensors. A metal layer is formed on top surfaces and sidewalls of the plurality of grid-filling regions. The metal layer is etched to remove horizontal portions of the metal layer, wherein vertical portions of the metal layer remain after the step of etching to form a metal grid. A transparent material is filled into grid openings of the metal grid.

22 Claims, 9 Drawing Sheets

METAL GRID IN BACKSIDE ILLUMINATION IMAGE SENSOR CHIPS AND METHODS FOR FORMING THE SAME

BACKGROUND

Backside Illumination (BSI) image sensor chips are replacing front-side illumination sensor chips for their higher efficiency in capturing photons. In the formation of the BSI image sensor chips, image sensors, such as photo diodes, and logic circuits are formed on a silicon substrate of a wafer, followed by the formation of an interconnect structure on a front side of the silicon chip.

The image sensors in the BSI image sensor chips generate electrical signals in response to the stimulation of photons. The magnitudes of the electrical signals (such as the currents) depend on the intensity of the incident light received by the respective image sensors. To reduce the optical cross-talks of the light received by different image sensors, metal grids are formed to isolate the light.

BRIEF DESCRIPTION OF THE DRAWINGS

For a more complete understanding of the embodiments, and the advantages thereof, reference is now made to the following descriptions taken in conjunction with the accompanying drawings, in which:

FIGS. 1 through 7 are cross-sectional views and top views of intermediate stages in the manufacturing of a Backside Illumination (BSI) image sensor chip in accordance with some exemplary embodiments.

DETAILED DESCRIPTION OF ILLUSTRATIVE EMBODIMENTS

The making and using of the embodiments of the disclosure are discussed in detail below. It should be appreciated, however, that the embodiments provide many applicable inventive concepts that can be embodied in a wide variety of specific contexts. The specific embodiments discussed are illustrative, and do not limit the scope of the disclosure.

A metal grid in a Backside Illumination (BSI) image sensor chip and the methods of forming the same are provided in accordance with various exemplary embodiments. The intermediate stages of forming the metal grid are illustrated. The variations of the embodiments are discussed. Throughout the various views and illustrative embodiments, like reference numbers are used to designate like elements.

Figure 1:
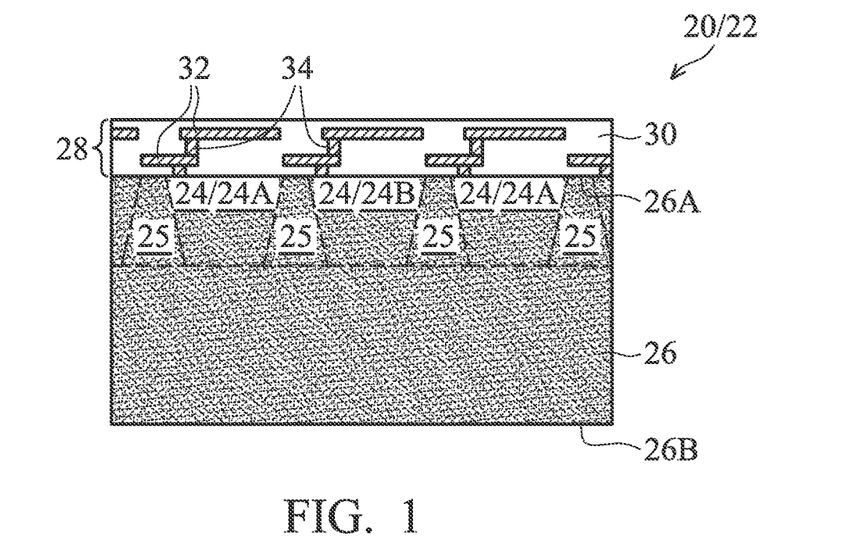

FIGS. 1 through 6 illustrate the cross-sectional views and a top view of intermediate stages in the manufacturing of a metal grid in accordance with some exemplary embodiments. FIG. 1 illustrates image sensor chip 20, which may be a part of an un-sawed wafer 22. Image sensor chip 20 includes semiconductor substrate 26. Semiconductor substrate 26 may be a crystalline silicon substrate or a semiconductor substrate formed of other semiconductor materials. Throughout the description, surface 26A is referred to a front surface of semiconductor substrate 26, and surface 26B is referred to as a back surface of semiconductor substrate 26. Image sensors 24 are formed at surface 26A of semiconductor substrate 26. Image sensors 24 are configured to convert light signals (photons) to electrical signals, and may be photo-sensitive Metal-Oxide-Semiconductor (MOS) transistors or photo-sensitive diodes. Accordingly, the respective wafer 22 may be an image sensor wafer. In some exemplary embodiments, image sensors 24 extend from front surface 26A into semiconductor substrate 26. Image sensors 24 include 24A and 24B that are disposed in an alternating pattern in each row and each column of the image sensor array (also see FIG. 3B) formed of image sensors 24. Image sensors 24A and 24B are identical to each other, although they are identified using different notations. Image sensors 24 may be separated from each other by field implantation regions 25, which are implanted portions of substrate 26.

Front-side interconnect structure 28 is formed over semiconductor substrate 26, and is used to electrically interconnect the devices in image sensor chip 20. Front-side interconnect structure 28 includes dielectric layers 30, and metal lines 32 and vias 34 in dielectric layers 30. Throughout the description, the metal lines 32 in a same dielectric layer 30 are collectively referred to as being a metal layer. Front-side interconnect structure 28 may include a plurality of metal layers. In some exemplary embodiments, dielectric layers 30 include low-k dielectric layers and passivation layers. The low-k dielectric layers have low k values, for example, lower than about 3.0. The passivation layers may be formed of non-low-k dielectric materials having k values greater than 3.9. In some embodiments, the passivation layers include a silicon oxide layer and a silicon nitride layer on the silicon oxide layer.

Figure 2:
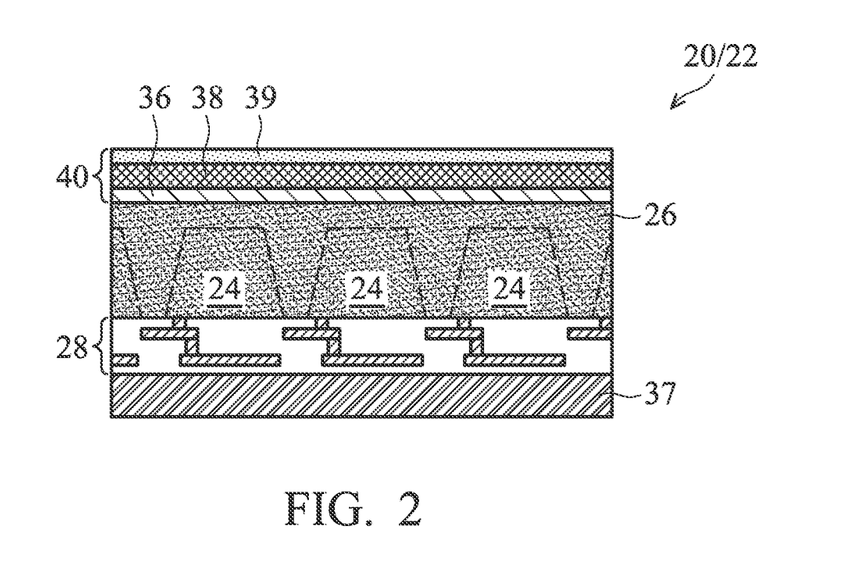

Referring to FIG. 2, carrier 37 is bonded to the front side of wafer 22, for example, through an oxide-to-oxide bonding. A backside grinding is performed to thin semiconductor substrate 26, and the thickness of wafer 22 is reduced to smaller than about 30 μm, or smaller than about 5 μm, for example. With semiconductor substrate 26 having a small thickness, light can penetrate from back surface 26B into semiconductor substrate 26, and reach image sensors 24A.

After the step of thinning, buffer layers 40 (also sometimes referred to as upper layers) are formed on the surface of semiconductor substrate 26. In some exemplary embodiments, buffer layers 40 include one or more of Bottom Anti-Reflective Coating (BARC) 36, silicon oxide layer 38, and silicon nitride layer 39. In some embodiments, silicon oxide layer 38 is formed using Plasma Enhanced Chemical Vapor Deposition (PECVD), and hence is referred to as Plasma Enhanced (PE) oxide layer 38. It is appreciated that buffer layers 40 may have different structures, formed of different materials, and/or have different number of layers other than illustrated.

Figure 3A:
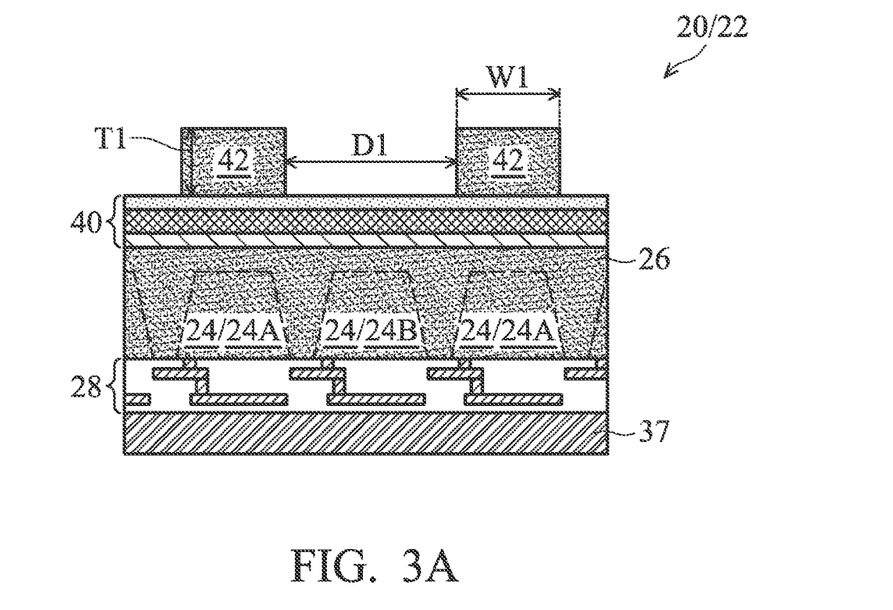
Figure 3B:
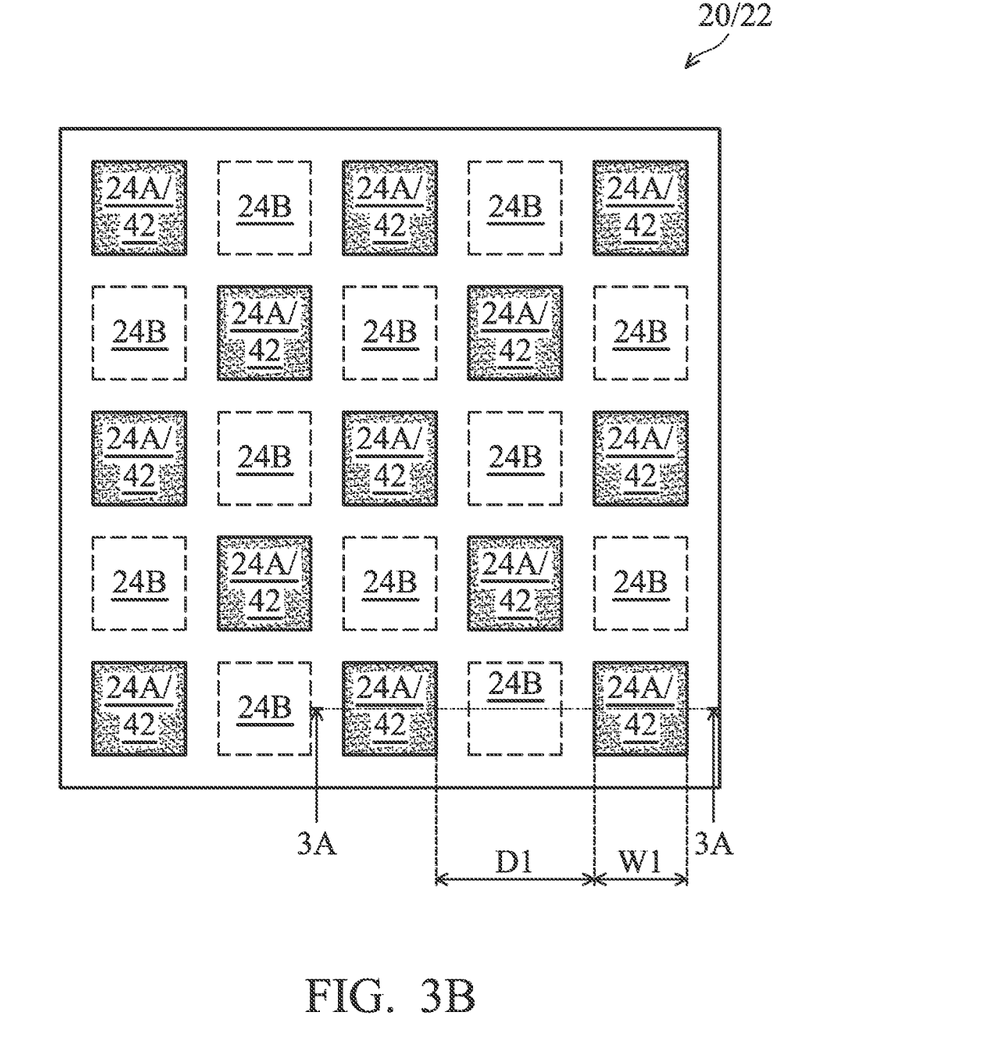

Next, as shown in FIGS. 3A and 3B, a grid-filling material is deposited and then patterned to form grid-filling regions 42. Each of grid-filling regions 42 overlaps one of image sensors 24A with a one-to-one correspondence, for example, with each of image sensors 24A underlying and aligned to one of grid-filling regions 42, and each of grid-filling regions 42 overlapping one of image sensors 24A. FIG. 3A illustrates a cross-sectional view. As shown in FIG. 3A, thickness T1 of grid-filling regions 42 is small enough so that light can penetrate through grid-filling regions 42. In some exemplary embodiments, thickness T1 of grid-filling regions 42 is between about 1,500 Å and about 3,000 Å. It is appreciated, however, that the values recited throughout the description are merely examples, and may be changed to different values. In some embodiments grid-filling regions 42 includes a dielectric material, which is transparent, and may be silicon oxide, silicon nitride, or the like. The formation methods may include, for example, a Chemical Vapor Deposition (CVD) method such as PECVD.

FIG. 3B illustrates a top view of the structure shown in FIG. 3A, wherein the cross-sectional view in FIG. 3A is obtained from the plane crossing line 3A-3A in FIG. 3B. In some embodiments, grid-filling regions 42 are arranged as a checkerboard pattern, wherein grid-filling regions 42 have the pattern of either the black color or the white color of a checkerboard. Grid-filling regions 42 overlap image sensors 24A, and do not overlap image sensors 24B. Grid-filling regions 42 may have top-view shapes of squares, although other top-view shapes such as rectangles (with lengths different from the respective widths) may also be adopted. Distance D1 between neighboring grid-filling regions 42 may be greater than the length/width W1 of grid-filling regions 42. Between each pair of neighboring grid-filling regions 42, there is a space overlapping one of image sensors 24B.

Figure 4:
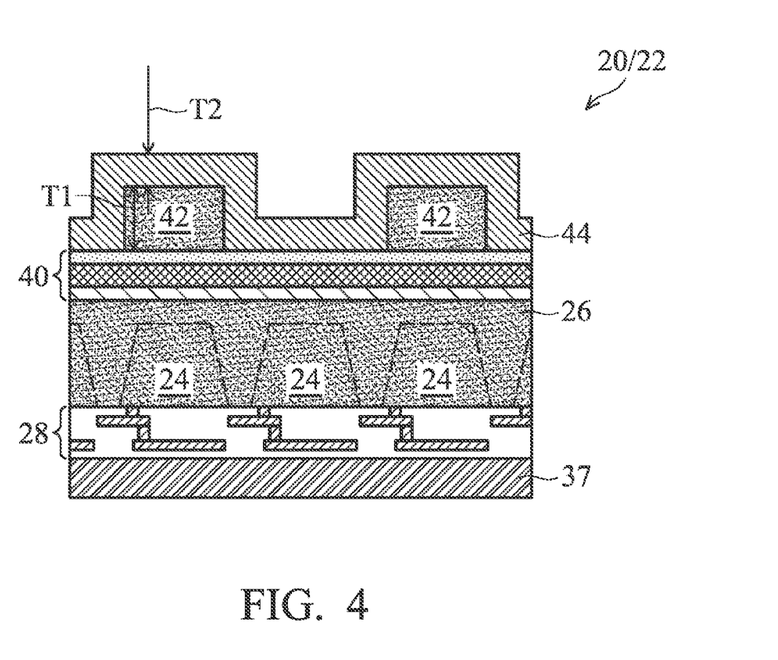

Referring to FIG. 4, metal layer 44 is deposited on the top surfaces and sidewalls of grid-filling regions 42. Metal layer 44 is also deposited into the space between neighboring grid-filling regions 42. In some embodiments, metal layer 44 includes a metal(s) or a metal alloy, wherein the metals in metal layer 44 may include tungsten, aluminum, copper, and/or the like. Thickness T2 of metal layer 44 is smaller than thickness T1 of grid-filling regions 42. In some embodiments, thickness T2 is between about 500 Å and about 2,000 Å, for example. Metal layer 44 may be deposited using a conformal deposition method such as Chemical Vapor Deposition (CVD), Physical Vapor Deposition (PVD), or the like. Accordingly, the thickness of the vertical portions of metal layer 44, which vertical portions are on the sidewalls of grid-filling regions 42, is close to the thickness of the horizontal portions over grid-filling regions 42. For example, the thickness of the vertical portions may be greater than about 70 percent, 80 percent, or 90 percent of the thickness of the horizontal portions.

Figure 5A:
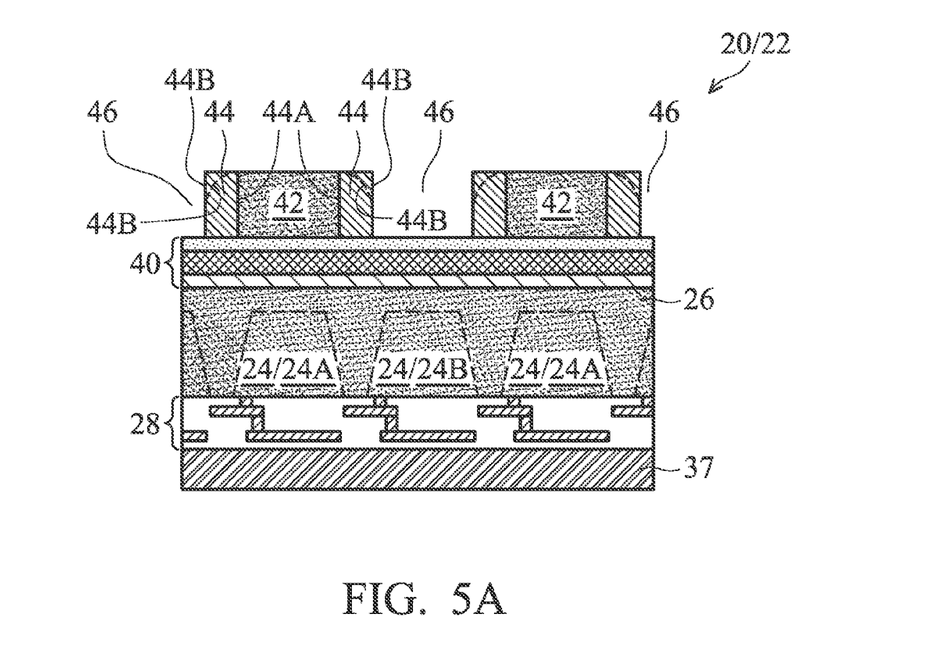
Figure 5B:
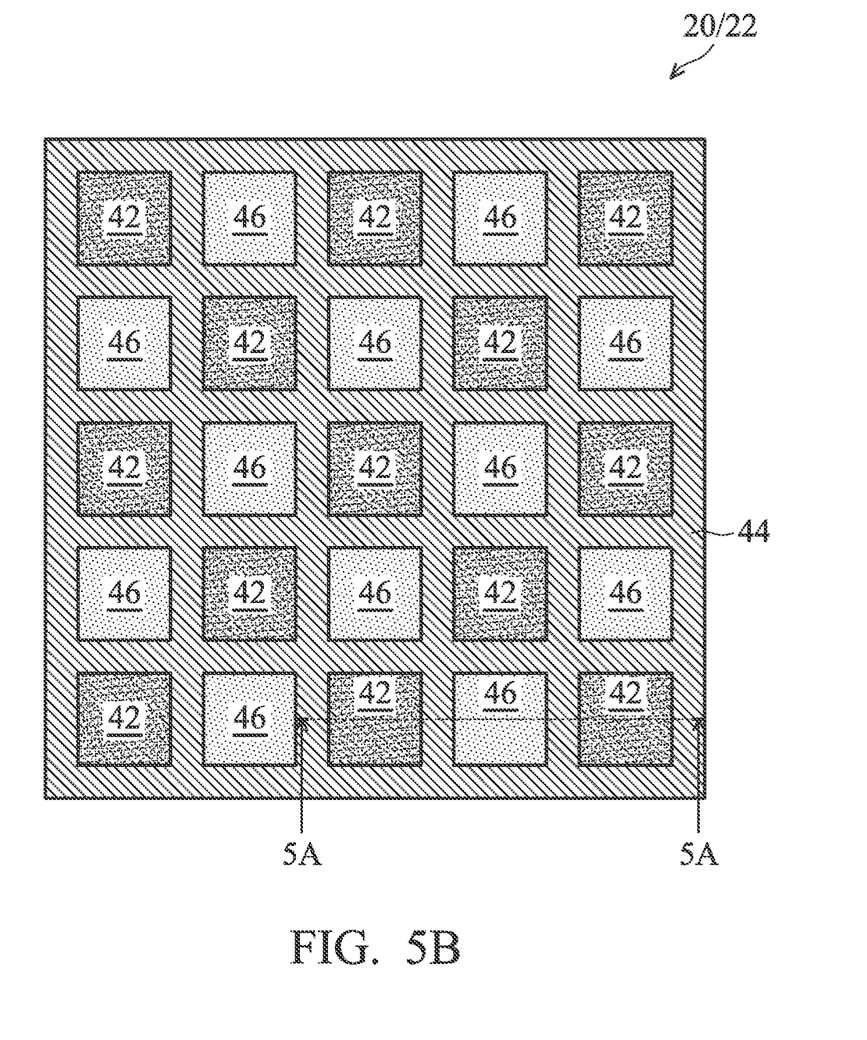

In FIGS. 5A and 5B, metal layer 44 is etched using an anisotropic etching method such as dry etching. FIG. 5A illustrates a cross-sectional view. As shown in FIG. 5A, the horizontal portions of metal layer 44, which horizontal portions include portions on the top surfaces of horizontal portions and the portions on buffer layers 40, are removed. Some sidewall portions of metal layer 44 remain un-etched after the etching step. After the etching step, some of the neighboring portions of metal layer 44 are spaced apart from each other by unfilled spaces 46, and some of the neighboring portions of metal layer 44 are spaced apart from each other by grid-filling regions 42. As a result of the etching process, the remaining portions of metal layer 44 may have sidewalls 44A adjoining grid-filling regions 42, and sidewalls 44B opposite to the respective sidewalls 44A. The profile of sidewalls 44A is determined by the profile of the sidewalls of grid-filling regions 42, and may be substantially vertical. On the other hand, the profile of sidewalls 44B is affected by the etching process. For example, sidewalls 44B may be sloped, as shown by the dashed lines, with the heights of the portions of sidewalls 44B closer to grid-filling regions 42 being higher than the heights of the portions of sidewalls 44B farther away from grid-filling regions 42. Furthermore, as shown by the dashed line, the heights of a sidewall 44B may gradually and continuously reduce from regions close to grid-filling regions 42 to regions away from grid-filling regions 42.

FIG. 5B illustrates a top view of the structure shown in FIG. 5A, wherein the cross-sectional view in FIG. 5A is obtained from the plane crossing line 5A-5A in FIG. 5B. It is shown that the remaining portions of metal layer 44 are interconnected to form a metal grid. The remaining portions of metal layer 44 are hence collectively referred to as metal grid 44 hereinafter. In each row and each column of the grid openings in metal grid 44, grid-filling regions 42 and spaces 46 are arranged in an alternating pattern. It is appreciated that by selecting appropriate thickness T1 of grid-filling regions 42 (FIG. 4), thickness T2 of metal layer 44, and distance D1 (FIG. 3B) between grid-filling regions 42, spaces 46 and grid-filling regions 42 in FIG. 5B may have top-view sizes close to each other. For example, distance D1 may be selected as being substantially equal to (W1+2*T2), and thickness T2 may be selected as being smaller than about 30 percent thickness T1.

Figure 6A:
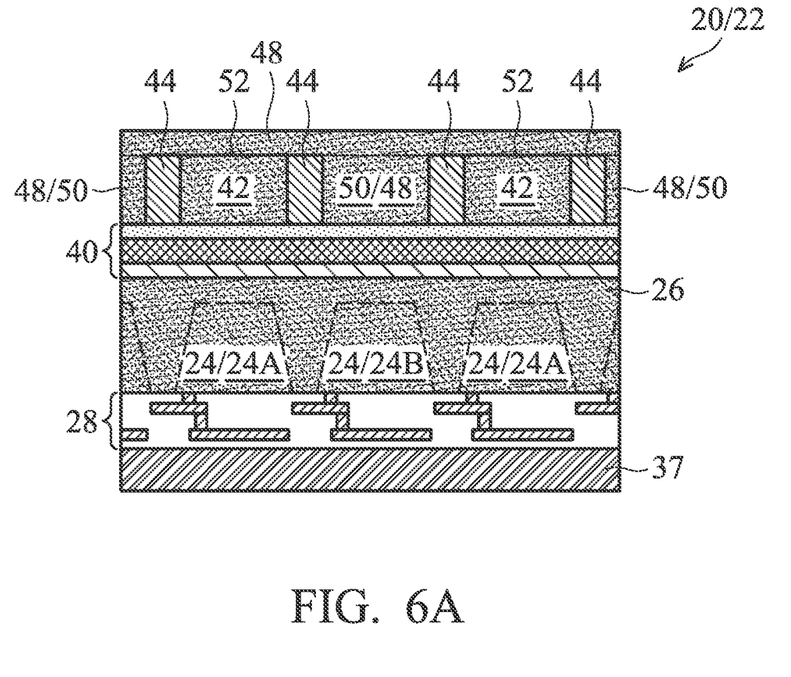
Figure 6B:
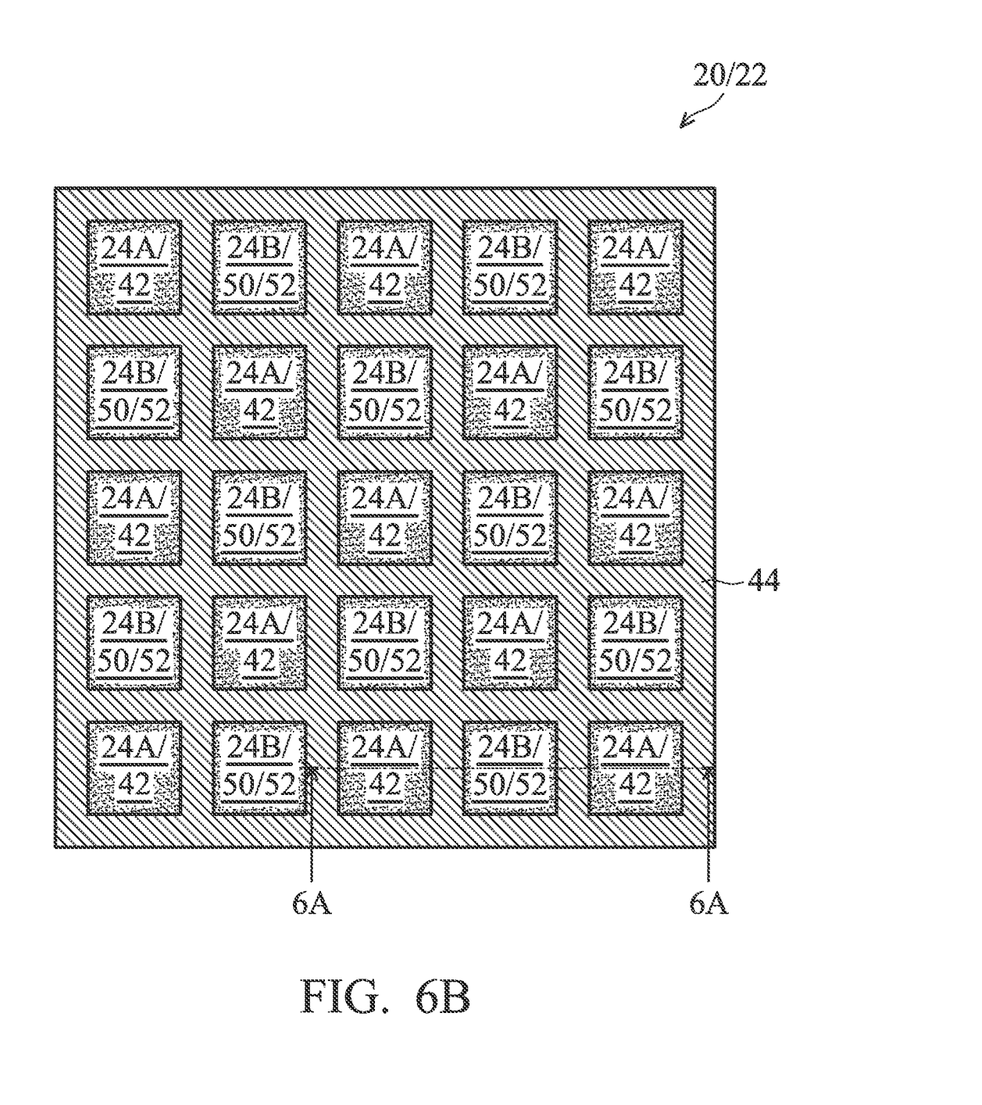

FIGS. 6A and 6B illustrate a cross-sectional view and a top view, respectively, in the formation of transparent layer 48, which is transparent with the small thickness it has. In some embodiments, transparent layer 48 is an oxide layer. The material of oxide layer 48 may be the same as, or different from, the material of grid-filling regions 42. Oxide layer 48 may be formed using PECVD or other deposition methods. After the deposition of oxide layer 48, a planarization step such as a Chemical Mechanical Polish (CMP) is performed to level the top surface of oxide layer 48.

Oxide layer 48 fills spaces 46 (FIGS. 5A and 5B). The portions of oxide layer 48 filling spaces 46 are also referred to as grid-filling regions 50 hereinafter. Oxide layer 48 further includes a portion over grid-filling regions 42 and metal grid 44. It is appreciated that since oxide layer 48 and grid-filling regions 42 are formed in different process steps, regardless of whether oxide layer 48 and grid-filling regions 42 are formed of the same material or not, distinguishable interfaces 52 may be generated between oxide layer 48 and grid-filling regions 42. On the other hand, since grid-filling regions 50 and the overlying portion of oxide layer 48 are formed in the same process step, and are formed of the same material, there is not interface generated therebetween. In some embodiments, interfaces 52 are substantially level with the top ends of metal grid 44. In alternative embodiments, depending on the process conditions in the etching step for forming metal grid 44 (FIG. 5A), interfaces 52 may be slightly higher than the top edges of metal grid 44.

FIG. 6B illustrates a top view of the structure shown in FIG. 6A, wherein the cross-sectional view in FIG. 6A is obtained from the plane crossing line 6A-6A in FIG. 6B. It is observed that in each row and each column of the grids defined by metal grid 44, grid-filling regions 42 and 50 are arranged in an alternating pattern. Furthermore, interfaces 52 appear in every other one of the checkerboard pattern.

Figure 7:
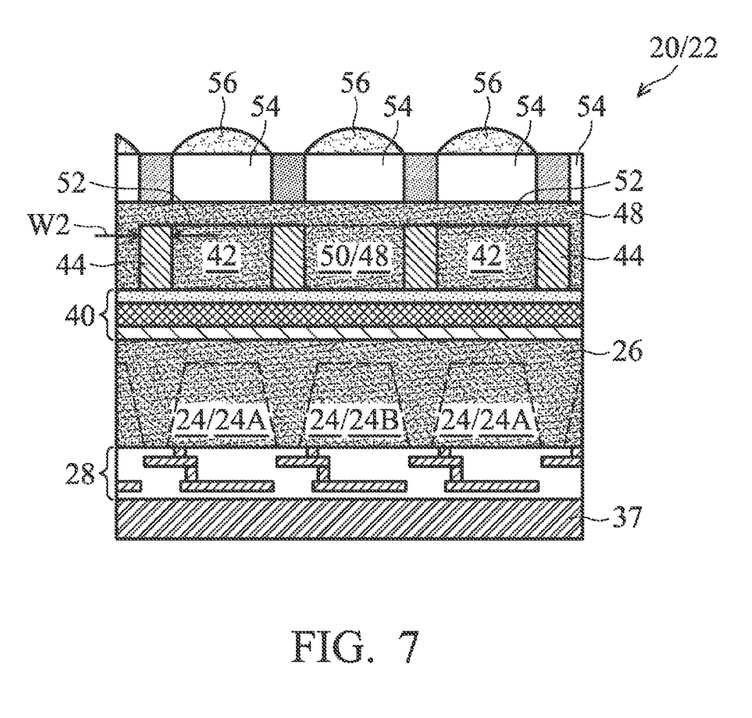

In subsequent process steps, as shown in FIG. 7, additional components such as color filters 54 and micro-lenses 56 are formed, with each of color filters 54 and micro-lenses 56 overlapping one of grid-filling regions 42 and 50. Furthermore, each of color filters 54 and micro-lenses 56, and grid-filling regions 42 and 50 overlaps one of image sensors 24.

In the structure shown in FIG. 7, it is observed that width W2 of metal grid 44 is partially determined by, and may be substantially equal to, thickness T2 (FIG. 4) of metal layer 44. Accordingly, the reduction of width W2 of metal grid 44 is no longer limited by lithography limits, which limitation exists in conventional processes for forming metal grids of the BSI chips.

In accordance with embodiments, a method includes forming a plurality of image sensors on a front side of a semiconductor substrate, and forming a dielectric layer on a backside of the semiconductor substrate. The dielectric layer is over the semiconductor substrate. The dielectric layer is patterned into a plurality of grid-filling regions, wherein each of the plurality of grid-filling regions overlaps one of the plurality of image sensors. A metal layer is formed on top surfaces and sidewalls of the plurality of grid-filling regions. The metal layer is etched to remove horizontal portions of the metal layer, wherein vertical portions of the metal layer remain after the step of etching to form a metal grid. A transparent material is filled into grid openings of the metal grid.

In accordance with other embodiments, a method includes forming a plurality of image sensors on a front side of a semiconductor substrate, wherein the plurality of image sensors forms an array. A dielectric layer is formed on a backside of the semiconductor substrate, wherein the dielectric layer is over the semiconductor substrate. The dielectric layer is patterned to form a first plurality of grid-filling regions. The first plurality of grid-filling regions overlaps a first plurality of image sensors in the array. The first plurality of image sensors comprises every other image sensors in each row and each column of the array. A metal layer is formed on top surfaces and sidewalls of the first plurality of grid-filling regions. The metal layer is etched so that horizontal portions of the metal layer are removed, wherein vertical portions of the metal layer remain after the step of etching to form a metal grid.

In accordance with yet other embodiments, a device includes a semiconductor substrate having a front side and a backside, and a plurality of image sensors disposed on the front side of the semiconductor substrate. The plurality of image sensors forms an array. A metal grid is disposed on the backside of, and over, the semiconductor substrate. A first plurality of grid-filling regions and a second plurality of grid-filling regions are disposed in grid openings of the metal grid, wherein the first and the second plurality of grid-filling regions are arranged in an alternating pattern in each row and each column of the grid openings. A dielectric layer is disposed over the first and the second plurality of grid-filling regions. No distinguishable interfaces are formed between the dielectric layer and the first plurality of grid-filling regions. Distinguishable interfaces are formed between the dielectric layer and the second plurality of grid-filling regions.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A method comprising:
    forming a plurality of image sensors on a front side of a semiconductor substrate, wherein the plurality of image sensors forms an array;
    forming a dielectric layer over a backside of the semiconductor substrate;
    patterning the dielectric layer into a plurality of grid-filling regions, wherein each of the plurality of grid-filling regions overlaps one of the plurality of image sensors, and wherein the step of patterning comprises removing first portions of the dielectric layer that overlap first alternating ones of the plurality of image sensors in each row and each column of the array;
    forming a metal layer on top surfaces and sidewalls of the plurality of grid-filling regions;
    etching the metal layer to remove the metal layer on the top surface of each grid-filling region thereby forming a metal grid on sidewalls of the plurality of grid-filling regions, wherein the metal grid comprises a first plurality of metal features continuously extending through a plurality of rows of the array, and a second plurality of metal features continuously extending through a plurality of columns of the array, and wherein the first plurality of metal features and the second plurality of metal features cross each other;
    filling a transparent material into grid openings of the metal grid, wherein the transparent material is a clear-colored material; and
    forming a plurality of color filters over the metal grid and the transparent material.

2. The method of claim 1, wherein the plurality of grid-filling regions has a pattern of one of the white color or black color of a checkerboard.

3. The method of claim 1, wherein a distance between two neighboring ones of the plurality of grid-filling regions is substantially equal to a sum of a width of one of the plurality of grid-filling regions and two times a thickness of the metal layer.

4. The method of claim 1, wherein the step of forming the metal layer is performed using a conformal deposition method.

5. The method of claim 1, wherein in the step of filling the transparent material into the grid openings of the metal grid, the grid openings are filled with a same material as the plurality of grid-filling regions.

6. The method of claim 1, wherein each of the grid openings overlaps one of the plurality of image sensors.

7. The method of claim 1, wherein the transparent material further covers the grid-filling regions and the metal grid.

8. A method comprising:
    forming a plurality of image sensors on a front side of a semiconductor substrate, wherein the plurality of image sensors forms an array, and wherein the plurality of image sensors comprises a first and a second plurality of image sensors, wherein in each row and each column of the array, image sensors in the first and the second plurality of image sensors are allocated in an alternating layout;
    forming a dielectric layer over a backside of the semiconductor substrate;
    patterning the dielectric layer to form a first plurality of grid-filling regions, wherein the first plurality of grid-filling regions overlaps the first plurality of image sensors in the array, and wherein the second plurality of image sensors is not overlapped by remaining portions of the dielectric layer;
    forming a metal layer on top surfaces and sidewalls of the first plurality of grid-filling regions;
    etching the metal layer to remove horizontal portions of the metal layer, wherein vertical portions of the metal layer remain after the step of etching to form a metal grid; and
    filling a clear-colored dielectric material into remaining grid openings of the metal grid not occupied by the first plurality of grid-filling regions to form second plurality of grid-filling regions, wherein the clear-colored dielectric material further comprises a top layer covering the first plurality of grid-filling regions, the second plurality of grid-filling regions, and the metal grid.

9. The method of claim 8 further comprising:
forming color filters and micro-lenses overlapping the first and the second plurality of grid-filling regions and the metal grid.

10. The method of claim 9, wherein the first and the second plurality of grid-filling regions are disposed as having a checkerboard pattern.

11. The method of claim 9, wherein the first and the second plurality of grid-filling regions have substantially a same top-view size.

12. The method of claim 8, wherein a distance between two neighboring ones of the first plurality of grid-filling regions is substantially equal to a sum of a width of one of the first plurality of grid-filling regions and two times a thickness of the metal layer.

13. The method of claim 8, wherein the step of forming the metal layer is performed using a conformal deposition method.

14. A method comprising:
forming a plurality of image sensors on a front side of a semiconductor substrate, wherein the plurality of image sensors forms an array;
forming a dielectric layer over a backside of the semiconductor substrate;
patterning the dielectric layer into a plurality of grid-filling regions, wherein the step of patterning comprises removing first portions of the dielectric layer that overlap first alternating ones of the plurality of image sensors in each row and each column of the array;
forming a metal layer on top surfaces and sidewalls of the plurality of grid-filling regions;
etching the metal layer to remove the metal layer on the top surface of each grid-filling region, wherein remaining portions of the metal layer forms a metal grid on sidewalls of the plurality of grid-filling regions, wherein the metal grid comprises a first plurality of metal features continuously extending through a plurality of rows of the array, and a second plurality of metal features continuously extending through a plurality of columns of the array, and wherein the first plurality of metal features and the second plurality of metal features cross each other; and
filling a transparent material into grid openings of the metal grid; and
forming a plurality of color filters over the metal grid and the transparent material.

15. The method of claim 14, wherein each of the plurality of grid-filling regions has lateral dimensions smaller than pitches of the plurality of image sensors.

16. The method of claim 14, wherein after the step of patterning the dielectric layer, spaces are formed in the metal grid, and wherein the spaces and the plurality of grid-filling regions are disposed in an alternating pattern in each row and each column of the metal grid.

17. The method of claim 14, wherein a distance between two neighboring ones of the plurality of grid-filling regions is substantially equal to a sum of a width of one of the plurality of grid-filling regions and two times a thickness of the metal layer.

18. The method of claim 14, wherein the step of forming the metal layer is performed using a conformal deposition method.

19. The method of claim 14, wherein spaces between the plurality of grid-filling regions are further arranged to overlap additional alternating ones of each row and each column of the array.

20. The method of claim 1, wherein during the patterning the dielectric layer, second portions of the dielectric layer that overlap second alternating ones of the plurality of image sensors in each row and each column of the array are not removed, and wherein the first and the second alternating ones of the plurality of image sensors in each row and each column of the array are allocated in an alternating layout.

21. The method of claim 14, wherein during the patterning the dielectric layer, second portions of the dielectric layer that overlap second alternating ones of the plurality of image sensors in each row and each column of the array are not removed, and wherein the first and the second alternating ones of the plurality of image sensors in each row and each column of the array are allocated in an alternating layout.

22. The method of claim 14, wherein the transparent material is a clear-colored material, and wherein the transparent material further covers the plurality of grid-filling regions and the metal grid.

* * * * *